(12) United States Patent
Shiah

(10) Patent No.: US 7,362,144 B2
(45) Date of Patent: Apr. 22, 2008

(54) LOW JITTER INPUT BUFFER WITH SMALL INPUT SIGNAL SWING

(75) Inventor: Chun Shiah, Taichung (TW)

(73) Assignee: Etron Technology, Inc., Hsin-Chu (TW)

( * ) Notice: Subject to any disclaimer, the term of this patent is extended or adjusted under 35 U.S.C. 154(b) by 429 days.

(21) Appl. No.: 10/631,841

(22) Filed: Jul. 31, 2003

(65) Prior Publication Data

US 2005/0024095 A1 Feb. 3, 2005

(51) Int. Cl.
*H03K 3/00* (2006.01)
(52) U.S. Cl. .......................... 327/108; 326/83
(58) Field of Classification Search ................. 327/52, 327/53, 56, 66, 65, 77, 78, 108; 326/83; 365/189.05, 230.08
See application file for complete search history.

(56) References Cited

U.S. PATENT DOCUMENTS

| | | | | |
|---|---|---|---|---|
| 5,978,310 A | | 11/1999 | Bae et al. | 365/230.08 |
| 6,002,618 A | | 12/1999 | Komarek et al. | 365/189.5 |
| 6,104,216 A | * | 8/2000 | Satoh | 327/78 |
| 6,373,328 B2 | * | 4/2002 | Rapp | 327/77 |
| 6,437,613 B2 | * | 8/2002 | Shim et al. | 327/108 |
| 6,512,400 B1 | * | 1/2003 | Forbes | 327/66 |

* cited by examiner

*Primary Examiner*—Kenneth B. Wells
(74) *Attorney, Agent, or Firm*—Saile Ackerman LLC; Stephen B. Ackerman; Billy Knowles

(57) ABSTRACT

A particular input buffer receiver includes a buffer input portion for receiving an input signal, a large capacitor between a bias node and the lower supply voltage, and a buffer output portion for producing an output signal. The circuit works to remove ground noise by charge coupling the bias voltage developed at the bias node to the lower supply voltage of the input device.

42 Claims, 3 Drawing Sheets

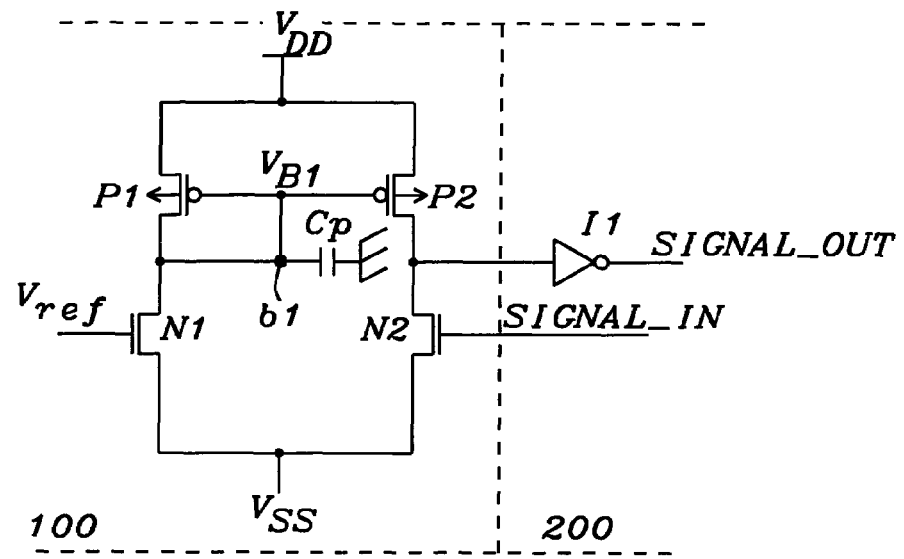
*FIG. 1 - Prior Art*
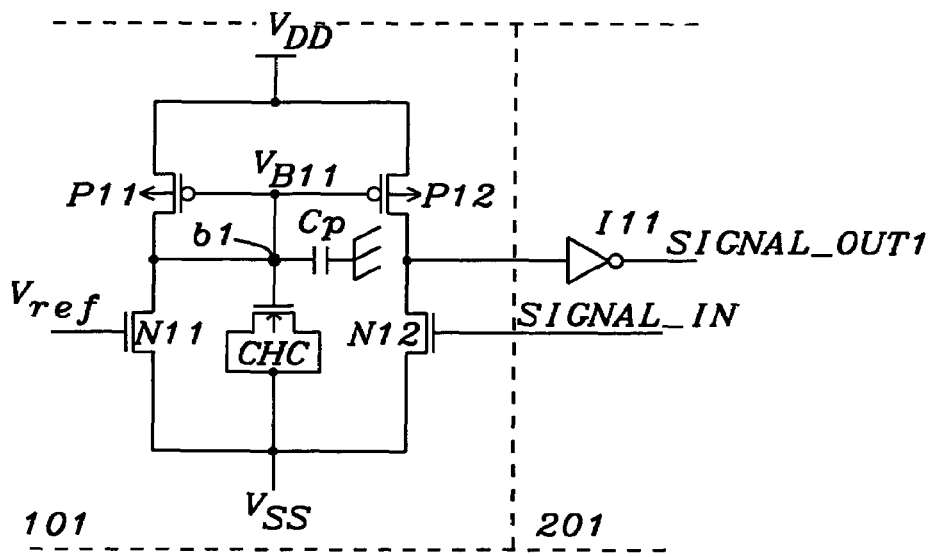
*FIG. 2*

LOW JITTER INPUT BUFFER WITH SMALL INPUT SIGNAL SWING

BACKGROUND OF THE INVENTION

1. Field of the Invention

The present invention generally relates to an interface circuit, and particularly to a low jitter input buffer.

2. Description of Related Art

Major design efforts have been directed at circuit design techniques involving input circuits for memory devices. A number of solutions have been proposed.

U.S. Pat. No. 5,978,310 (Bae et al) describes an input buffer for a DRAM memory device, which removes noise from the row address strobe. The device has a data output enable, which can be delayed for a predetermined time, and which also produces a control signal for the output. There is also a buffer output for producing the noise free input according to the control signal.

U.S. Pat. No. 6,002,618 (Komarek et al) discloses an NMOS input receiver circuit for a read only memory. It includes a feedback loop to control hysteresis. There is a second stage and an additional output for the receiver. Switching noise from inside the memory is isolated and cannot be fed back into the receiver circuit to affect the TTL voltage levels. Wide, long FET sizes are used to minimize manufacture variations in the receiver switching levels.

What is still needed is a mechanism by which an input buffer works in the presence of ground noise, specifically how capacitance can be used to reduce such noise for a memory input circuit.

SUMMARY OF THE INVENTION

It is therefore an object of the present invention to provide an efficient circuit design technique for an input buffer receiver for a particular memory device that works to filter ground noise. It is a further object of the invention to provide a means for reducing jitter in an input buffer. This is achieved by attaching a large capacitance to the bias node of the input buffer receiver.

These and other objects are achieved by an input buffer receiver comprising: a buffer input portion for receiving an input signal; a large capacitor between a bias node and a lower supply voltage VSS, and a buffer output potion for producing an output signal. Furthermore, in the input buffer receiver, the biasing voltage of the bias node is charge coupled to the lower voltage source. This results in a quicker response time for the output signal.

BRIEF DESCRIPTION OF THE DRAWINGS

The foregoing and other objects, aspects, and advantages will be better understood from the following detailed description of a preferred embodiment of the invention, with reference to the drawings, in which:

FIG. 1 is a diagram of an input buffer receiver according to the prior art.

FIG. 2 is a diagram of an input buffer receiver according to the present invention.

DETAILED DESCRIPTION OF THE INVENTION

Figure 3A:
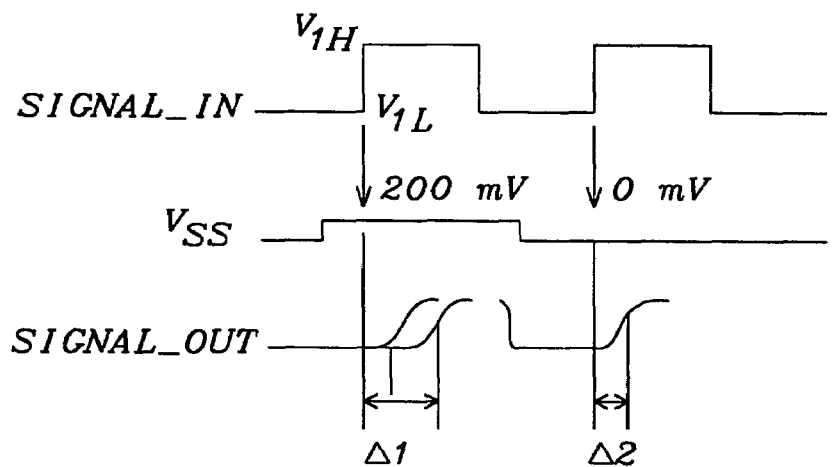
FIGS. 3A-B show the timing diagrams of the input buffer receiver of the present invention and the definitions of JITTER_RISE and JITTER_FALL.

One embodiment of the present invention is provided below with reference to the accompanying diagrams.

Referring to FIG. 1, the input buffer receiver of the prior art includes a buffer input portion 100 for receiving an input signal SIGNAL_IN and a buffer output portion 200 for producing an output signal SIGNAL_OUT.

The buffer input portion 100 is comprised of: NMOS transistors N1 and N2, where a lower supply voltage VSS is applied to the source nodes of NMOS transistors N1 and N2, and PMOS transistors P1 and P2, where an upper voltage supply VDD is applied to the source nodes. The gate nodes of transistors P1 and P2 and the drains of transistors N1 and P1 are connected together to form the biasing node b1. The biasing voltage VB1 is developed at the biasing node b1 as a result of the configuration of transistors P1 and P2. A parasitic capacitor Cp is present from the biasing node b1 to the ground reference node. In the prior art, a reference voltage VREF is applied to the gate of transistor N1, input signal SIGNAL_IN is applied to the gate of transistor N2. Input signal SIGNAL_IN is a low swing signal coming from off chip. The buffer output portion 200 is comprised of a common node for the drain of transistor N2 and drain of transistor P2, which serves as input to inverter I1. The output of inverter I1 is the output signal output SIGNAL_OUT.

The ground noise (VSS noise), as described above, is developed between the lower supply voltage VSS and the ground reference voltage. The magnitude of the VSS noise affects the delay timing from the input signal SIGNAL_IN to the output signal SIGNAL_OUT. The variation in the delay causes jitter in the rise and fall delays of the buffer and thus slower response times.

Referring to FIG. 2, the proposed invention is comprised of a similar buffer input portion 101 and a similar buffer output portion 201. The buffer input portion 101 is comprised of: NMOS transistors N11 and N12, where the lower supply voltage VSS is applied to the source nodes of N11 and N12, and PMOS transistors P11 and P12, where an upper supply voltage VDD is applied to the source nodes. The gate nodes of transistors P11 and P12 and the drains of transistors N11 and P11 are connected together to form the biasing node b11. The biasing voltage VB11 is developed at the biasing node b11 as a result of the configuration of transistors P11 and P12. A parasitic capacitor Cp is present from the biasing node b11 to the ground reference node. A reference supply voltage VREF is applied to the gate of transistor N11, input signal SIGNAL$_{13}$ IN is applied to the gate of N12. In the present invention, a large capacitor CHC is attached between the bias node b11 and the lower supply voltage VSS. The buffer output potion 201 is comprised of a common node for the drain of transistor N12 and the drain of transistor P12, which serves as input to inverter I11. The output of inverter I11 is the output signal SIGNAL_OUT1 of the invention.

The large capacitance CHC is in series with the parasitic capacitor Cp of the input buffer receiver transistors N11, P11, and P12. The large capacitor CHC, as connected, is designed to have an extremely large capacitance relative to the parasitic capacitor Cp such that the bias voltage VB11 essentially follows the voltage changes in the lower supply voltage VSS preventing the effects of the VSS noise. This coupling ratio is determined by the formula:

$$\frac{CHC}{Cp + CHC} \approx 1$$

where:
CHC is the capacitance value of the large capacitor CHC.
Cp is the capacitance value of the parasitic capacitor Cp.

Because of its large coupling ratio (very close to 1), the capacitor CHC essentially charge couples or AC couples the biasing voltage VB11 at the bias node b11 to the lower supply voltage VSS, of devices N11 and N12. This forces the transistors N11 and N12 to activate and deactivate essentially simultaneously, allowing for a quicker response time on output signal SIGNAL_OUT1.

Figure 3B:
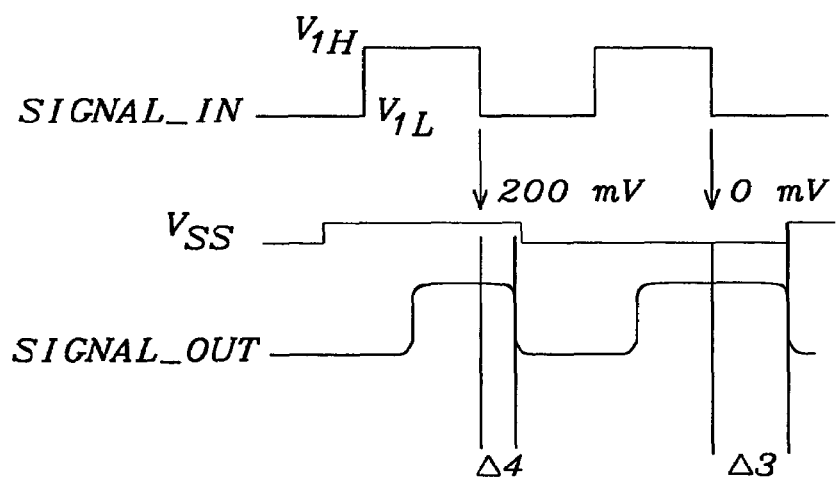

FIGS. 3A-B are diagrams of timed operation showing the input signal SIGNAL_IN, the lower supply voltage VSS, and the output signal SIGNAL_OUT1 of the proposed invention. It should be noted that the input signal SIGNAL_IN is defined as VIH=VREF+350 mv and VIL=VREF−350 mv, and VSS is 200 mv. The output signal SIGNAL_OUT1 is defined by the delay times DELTA1 or DELTA2, when input signal SIGNAL_IN rises, and the delay times DELTA3 or DELTA4, when the input signal SIGNAL_IN falls. The delay time DELTA1 is defined as the delay from the rising edge of input signal SIGNAL_IN to the rising edge of output signal SIGNAL_OUT, when VSS=200 mv. It is the delay on output signal SIGNAL_OUT1 when transistor N12 sees VSS noise and turns on weakly. The delay time DELTA2 is defined as the delay from the rising edge of input signal SIGNAL_IN to the rising edge of output signal SIGNAL_OUT1, when VSS=0 v. It is the delay of the output signal SIGNAL_OUT1 when transistor N12 does not see VSS noise and turns on strongly. The delay time DELTA3 is defined as the delay from the falling edge of input signal SIGNAL_IN to the falling edge of output SIGNAL_OUT1, when VSS=0 v. It is the delay of the input signal SIGNAL_OUT1 when transistor N12 does not see VSS noise and turns off weakly. DELTA4 is defined as the delay from the falling edge of input signal SIGNAL_IN to the falling edge of output signal SIGNAL_OUT1, when VSS=200 mv. It is the delay seen on output signal SIGNAL_OUT1 when transistor N12 sees VSS noise and turns off strongly. By definition, the delay times DELTA2 and DELTA4 are smaller than the delay times DELTA1 and DELTA3. The rise time jitter JITTER_RISE is the difference between the delay times DELTA1 and DELTA2 when the input signal SIGNAL_IN rises and the fall time jitter JITTER_FALL is the difference between the delay times DELTA3 and DELTA4 when input signal SIGNAL_IN falls. The intent of the invention large capacitor CHC is to reduce rise time jitter JITTER_RISE and fall time jitter JITTER_FALL by primarily having transistors P12 and N12, activate, in the presence or absence of ground noise, almost simultaneously.

Figure 4A:
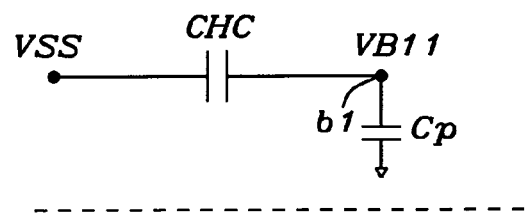
FIGS. 4A-B illustrate the workings of capacitor CHC to reduce JITTER_RISE and JITTER_FALL.
Figure 4B:
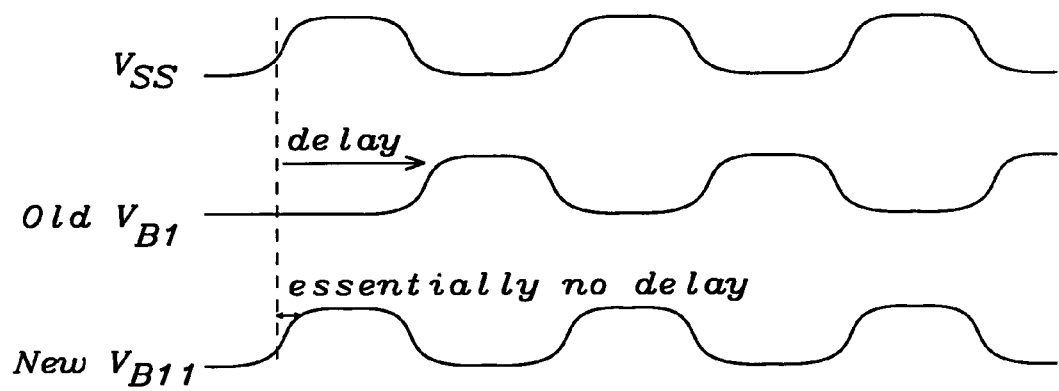

FIGS. 4A-B illustrate the workings of large capacitor CHC. In FIG. 4a, the large capacitor is shown in series with the parasitic capacitor Cp. The large capacitance coupling ratio of the large capacitor CHC versus the capacitance of the parasitic capacitor Cp creates a charge coupling of the bias node, b11, of the input buffer receiver, to the lower supply voltage VSS, of the input buffer receiver. This results in a quicker response time for a input signal SIGNAL_OUT1.

While the invention has been described in terms of the preferred embodiments, those skilled in the art will recognize that various changes in form and details may be made without departing from the spirit and scope of the invention. The present invention covers modifications that fall within the range of the appended claims and their equivalents.

While this invention has been particularly shown and described with reference of the preferred embodiments thereof, it will be understood by those skilled in the art that various changes in form and details may be made without departing from the spirit and scope of the invention.

What is claimed is:

1. An input buffer receiver comprising:
    a buffer input portion for receiving an input signal, said buffer input portion comprising a bias node;
    a large capacitor coupled between the bias node and a lower supply voltage for providing a coupling ratio between a capacitance value of said large capacitor and a capacitance value of a parasitic capacitor coupled between said bias node and a ground reference point is approximately equal to a unity value such that a biasing voltage at said biasing node follows said lower supply voltage to minimize effects of a ground noise signal between the lower supply voltage and the ground reference point; and
    a buffer output portion in communication with the buffer input portion for producing an output signal.

2. The input buffer receiver of claim 1, wherein the buffer input portion which receives the input signal further comprises:
    a first transistor of a first conductivity type having a source node to which the lower supply voltage is applied, a gate node to which a reference voltage is applied, and a drain node at which the biasing voltage is developed;
    a second transistor of a second conductivity type having a drain node which is connected to the drain node of the first transistor, and a gate node at which the biasing voltage is developed, and a source node to which an upper supply voltage source is applied;
    a third transistor of the second conductivity type having a drain node, a gate node at which the biasing voltage is developed, and a source node to which the upper supply voltage source is applied;
    a fourth transistor of the first conductivity type having a source node to which the lower supply voltage is applied, a gate node to which the input signal is applied, and a drain node which is coupled to the drain of a fourth transistor and to an input node of the buffer output portion.

3. The input buffer receiver of claim 2, wherein the first and fourth transistor are NMOS transistors, and the second and third transistors are PMOS transistors.

4. The input buffer receiver of claim 2, wherein the large capacitor is connected between the sources of the first and fourth transistors of the buffer input portion and the gate of the second transistor of the buffer input portion.

5. The input buffer receiver of claim 2, wherein the gate of the second transistor is connected to its drain.

6. The input buffer receiver of claim 2, wherein the gate of the second transistor is connected to the drain of the first transistor.

7. The input buffer receiver of claim 2, wherein the gate of the second transistor is connected to the gate of the third transistor.

8. The input buffer receiver of claim 2, wherein the buffer output portion which produces the output signal comprises:
    a first inverter connected to the drain of the third transistor and the drain of the fourth transistor.

9. The input buffer receiver of claim 2, wherein the third transistor and the fourth transistor activate and deactivate almost simultaneously as determined by said input signal to minimize the effects of ground noise on a delay jitter factor of said input buffer.

10. The input buffer receiver of claim 1, wherein the large capacitor charge couples the bias node of the input buffer receiver to the lower supply voltage of the input buffer receiver and wherein a capacitance value of the large capacitor is selected by the formula:

$$\frac{CHC}{Cp + CHC} \approx 1$$

where:
CHC is the capacitance value of the large capacitor, and
Cp is the capacitance value of the parasitic capacitor.

11. The input buffer receiver of claim 1, wherein the capacitance value of the large capacitor is chosen to be very large with respect to said capacitance value of said parasitic capacitor and results in a quicker response time for the output signal.

12. An integrated circuit formed on a substrate comprising:
an input buffer receiver for receiving an input signal, said input buffer comprising:
a buffer input portion for receiving the input signal, said buffer input portion comprising a bias node;
a large capacitor coupled between the bias node and a lower supply voltage for providing a coupling ratio between a capacitance value said large capacitor and a capacitance value of a parasitic capacitor coupled between said bias node and a ground reference point is approximately equal to a unity value such that a biasing voltage at said biasing node follows said lower supply voltage to minimize effects of a ground noise signal between the lower supply voltage and the ground reference point; and
a buffer output portion in communication with the buffer input portion for producing an output signal.

13. The integrated circuit of claim 12, wherein the buffer input portion of the input buffer receiver further comprises:
a first transistor of a first conductivity type having a source node to which the lower supply voltage is applied, a gate node to which a reference voltage is applied, and a drain node at which the biasing voltage is developed;
a second transistor of a second conductivity type having a drain node which is connected to the drain node of the first transistor, and a gate node at which the biasing voltage is developed, and a source node to which an upper supply voltage source is applied;
a third transistor of the second conductivity type having a drain node, a gate node at which the biasing voltage is developed, and a source node to which the upper supply voltage source is applied;
a fourth transistor of the first conductivity type having a source node to which the lower supply voltage is applied, a gate node to which an input signal is applied, and a drain node which is connected to the drain of a fourth transistor and to an input node of the buffer output portion.

14. The integrated circuit of claim 13, wherein the first and fourth transistors are NMOS transistors, and the second and third transistors are PMOS transistors.

15. The integrated circuit of claim 13, wherein the large capacitor is connected between the sources of the first and fourth transistors of the buffer input portion and the gate of the second transistor of the buffer input portion.

16. The integrated circuit of claim 13, wherein the gate of the second transistor is connected to its drain.

17. The integrated circuit of claim 13, wherein the gate of the second transistor is connected to the drain of the first transistor.

18. The integrated circuit of claim 13, wherein the gate of the second transistor is connected to the gate of the third transistor.

19. The integrated circuit of claim 13, wherein the buffer output portion which produces said output signal comprises:
a first inverter connected to the drain of the third transistor and the drain of the fourth transistor.

20. The integrated circuit of claim 13, wherein the third transistor and the fourth transistor activate and deactivate almost simultaneously as determined by said input signal to minimize the effects of ground noise on a delay jitter factor of said input buffer.

21. The integrated circuit of claim 12, wherein the large capacitor charge couples the bias node of the input buffer receiver to the lower supply voltage of the input buffer receiver and wherein a capacitance value of the large capacitor is selected by the formula:

$$\frac{CHC}{Cp + CHC} \approx 1$$

where:
CHC is the capacitance value of the large capacitor, and
Cp is the capacitance value of the parasitic capacitor.

22. The integrated circuit of claim 12, wherein the capacitance value of the large capacitor is chosen to be very large with respect to said capacitance value of said parasitic capacitor and results in a quicker response time for the output signal.

23. A method for minimizing effects of ground noise on an input buffer receiver comprising the steps of:
forming a buffer input portion for receiving an input signal on a substrate;
forming a bias node within said buffer input portion;
connecting a lower supply voltage to said buffer input portion;
forming a large capacitor coupled between the bias node and the lower supply voltage for providing a coupling ratio between a capacitance value of said large capacitor and a capacitance value of a parasitic capacitor coupled between said bias node and a ground reference point is approximately equal to a unity value such that a biasing voltage at said biasing node follows said lower supply voltage to minimize effects of said ground noise between the lower supply voltage and the ground reference point; and
forming a buffer output portion on said substrate in communication with the buffer input portion for producing an output signal.

24. The method of claim 23, wherein forming the buffer input portion further comprises the steps of:
forming a first transistor of a first conductivity type on said substrate;
applying the lower supply voltage to a source node of the first transistor;

applying a reference voltage to a gate node of the first transistor;

connecting a drain node of the first transistor to develop a biasing voltage at said drain node;

forming a second transistor of a second conductivity type on said substrate;

connecting a drain node of the second transistor to the drain node of the first transistor;

connecting a gate node of the second transistor to the drain node of the first transistor for developing the biasing voltage; and connecting a source node of the second transistor to an upper supply voltage;

forming a third transistor of the second conductivity type on said substrate;

connecting a gate node of the third transistor to the drain node of the first transistor for developing the biasing voltage;

connecting a source node of the third transistor to the upper supply voltage source;

forming a fourth transistor of the first conductivity type on said substrate;

connecting a source node of the fourth transistor to the lower supply voltage;

connecting a gate node of the fourth transistor to receive an input signal; and connecting a drain node of the fourth transistor to a drain node of the third transistor and to an input node of the buffer output portion.

25. The method of claim 24, wherein the first and fourth transistors are NMOS transistors, and the second and third transistors are PMOS transistors.

26. The method of claim 24, wherein forming the large capacitor comprises the step of:

connecting said large capacitor between the sources of the first and fourth transistors of the buffer input portion and the gate of the second transistor of the buffer input portion.

27. The method of claim 24, wherein forming the buffer input portion further comprises the steps of:

connecting the gate of the second transistor to its drain.

28. The method of claim 24, wherein forming the buffer input portion further comprises the steps of:

connecting the gate of the second transistor to the gate of the third transistor.

29. The method of claim 24, wherein forming the buffer output portion which produces the output signal comprises the step of:

forming a first inverter on said substrate; and connecting an input of said first inverter to the drain of the third transistor and the drain of the fourth transistor.

30. The method of claim 24, wherein the third transistor and the fourth transistor activate and deactivate almost simultaneously as determined by said input signal to minimize the effects of ground noise on a delay jitter factor of said input buffer.

31. The method of claim 23, wherein the large capacitor charge couples the bias node of the input buffer receiver to the lower supply voltage of the input buffer receiver and wherein a capacitance value of the large capacitor is selected by the formula:

$$\frac{CHC}{Cp + CHC} \approx 1$$

where:

CHC is the capacitance value of the large capacitor, and Cp is the capacitance value of the parasitic capacitor.

32. The method of claim 23, wherein the capacitance value of the large capacitor is chosen to be very large with respect to said capacitance value of said parasitic capacitor and results in a quicker response time for the output signal.

33. An apparatus for minimizing effects of ground noise within an input buffer receiver, said apparatus comprising:

means for forming a buffer input portion for receiving an input signal on a substrate;

means for forming a bias node within said buffer input portion;

means for connecting a lower supply voltage to said buffer input portion;

means for forming a large capacitor between the bias node and the lower supply voltage for providing a coupling ratio between a capacitance value of said large capacitor and a capacitance value of a parasitic capacitor coupled between said bias node and a ground reference point is approximately equal to a unity value such that a biasing voltage at said biasing node follows said lower supply voltage to minimize effects of said ground noise between the lower supply voltage and the ground reference point; and means for forming a buffer output portion on said substrate in communication with the buffer input portion for producing an output signal.

34. The apparatus of claim 33, wherein forming the buffer input portion further comprises:

means for forming a first transistor of a first conductivity type on said substrate;

means for applying the lower supply voltage to a source node of the first transistor;

means for applying a reference voltage to a gate node of the first transistor;

means for connecting a drain node of the first transistor to develop as biasing voltage at said drain node;

means for forming a second transistor of a second conductivity type on said substrate;

means for connecting a drain node of the second transistor to the drain node of the first transistor;

means for connecting a gate node of the second transistor to the drain node of the first transistor for developing the biasing voltage; and means for connecting a source node of the second transistor to an upper supply voltage;

means for forming a third transistor of the second conductivity type on said substrate;

means for connecting a gate node of the third transistor to the drain node of the first transistor for developing the biasing voltage;

means for connecting a source node of the third transistor to the upper supply voltage source;

means for forming a fourth transistor of the first conductivity type on said substrate;

means for connecting a source node of the fourth transistor to the lower supply voltage;

means for connecting a gate node of the fourth transistor to receive said input signal; and connecting a drain node of the fourth transistor to a drain node of the third transistor and to an input of the buffer output portion.

35. The apparatus of claim 34, wherein the first and fourth transistors are NMOS transistors, and the second and third transistors are PMOS transistors.

36. The apparatus of claim 34, wherein means for forming the large capacitor comprises:
   means for connecting said large capacitor between the sources of the first and fourth transistors of the buffer input portion and the gate of the second transistor of the buffer input portion.

37. The apparatus of claim 34, wherein means for forming the buffer input portion further comprises:
   means for connecting the gate of the second transistor to its drain.

38. The apparatus of claim 34, wherein means for forming the buffer input portion further comprises the steps of:
   means for connecting the gate of the second transistor to the gate of the third transistor.

39. The apparatus of claim 34, wherein means for forming the buffer output portion which produces said output signal comprises:
   means for forming a first inverter on said substrate; and
   means for connecting an input of said first inverter to the drain of the third transistor and the drain of the fourth transistor.

40. The apparatus of claim 34, wherein the third transistor and the fourth transistor activate and deactivate almost simultaneously as determined by said input signal to minimize the effects of ground noise on a delay jitter factor of said input buffer.

41. The apparatus of claim 33, wherein the large capacitor charge couples the bias node of the input buffer receiver to the lower supply voltage of the input buffer receiver and wherein a capacitance value of the large capacitor is selected by the formula:

$$\frac{CHC}{Cp + CHC} \approx 1$$

where:
   CHC is the capacitance value of the large capacitor CHC, and
   Cp is the capacitance value of the parasitic capacitor Cp.

42. The apparatus of claim 33, wherein the capacitance value of the large capacitor is chosen to be very large with respect to said capacitance value of said parasitic capacitor and results in a quicker response time for the output signal.

* * * * *